United States Patent
Mollard et al.

(10) Patent No.: US 11,031,438 B2
(45) Date of Patent: Jun. 8, 2021

(54) PIXEL FOR AN ORGANIC LIGHT-EMITTING DIODE MICROSCREEN

(71) Applicant: Commissariat A L'Energie Atomique et aux Energies Alternatives, Paris (FR)

(72) Inventors: Laurent Mollard, Grenoble (FR); Tony Maindron, Grenoble (FR); Myriam Tournaire, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/544,949

(22) Filed: Aug. 20, 2019

(65) Prior Publication Data

US 2020/0066808 A1    Feb. 27, 2020

(30) Foreign Application Priority Data

Aug. 21, 2018  (FR) ...................... 18 57558

(51) Int. Cl.
*H01L 27/32* (2006.01)
*H01L 51/52* (2006.01)
*H01L 51/56* (2006.01)

(52) U.S. Cl.
CPC ...... *H01L 27/3211* (2013.01); *H01L 51/5265* (2013.01); *H01L 51/5271* (2013.01); *H01L 51/56* (2013.01); *H01L 27/3293* (2013.01); *H01L 2251/5315* (2013.01)

(58) Field of Classification Search
CPC ........ H01L 51/5265; H01L 27/3211–27/3218; H01L 2251/558
See application file for complete search history.

(56) References Cited

U.S. PATENT DOCUMENTS

| | | | | |
|---|---|---|---|---|
| 7,923,920 B2* | 4/2011 | Nakamura | ......... | H01L 51/5271 313/504 |
| 10,334,692 B2* | 6/2019 | Kikuchi | ................ | H05B 33/22 |
| 10,340,480 B1* | 7/2019 | Peckham | ........... | H01L 51/5271 |
| 10,541,275 B2* | 1/2020 | Sakairi | ............... | H01L 51/5218 |
| 2006/0214573 A1* | 9/2006 | Maeda | ............... | H01L 51/5271 313/506 |

(Continued)

OTHER PUBLICATIONS

French Preliminary Search Report dated Jul. 3, 2019 in French Application 18 57558, filed on Aug. 21, 2018 (with English Translation of Categories of Cited Documents & Written Opinion).

*Primary Examiner* — Stephen M Bradley
(74) *Attorney, Agent, or Firm* — Oblon, McClelland, Maier & Neustadt, L.L.P.

(57) ABSTRACT

A pixel includes, successively a substrate; a reflector that is reflective in the visible spectrum; a spacing layer; a first, transparent electrode; a stack of organic light-emitting layers that is configured to emit a white light; a second, semitransparent electrode that is formed on the stack, the second electrode and the reflector forming an optical resonator; the spacing layer having first, second and third portions, the thicknesses of which are adjusted such that the optical resonator allows, respectively, the transmission of red, green and blue light; noteworthy in that the first and second portions of the spacing layer each include lateral edges that are covered with a material that is reflective in the visible spectrum.

21 Claims, 8 Drawing Sheets

(56) References Cited

U.S. PATENT DOCUMENTS

| | | |
|---|---|---|
| 2007/0015429 A1* | 1/2007 | Maeda ................ H01L 51/5206 |
| | | 445/24 |
| 2007/0102737 A1 | 5/2007 | Kashiwabara et al. |
| 2011/0241038 A1 | 10/2011 | Kashiwabara et al. |
| 2012/0299031 A1* | 11/2012 | Shiratori ............. H01L 27/3206 |
| | | 257/89 |
| 2013/0207138 A1 | 8/2013 | Kashiwabara et al. |
| 2014/0284576 A1* | 9/2014 | Sugisawa ............ H01L 27/3246 |
| | | 257/40 |
| 2014/0295597 A1 | 10/2014 | Sato et al. |
| 2014/0332832 A1 | 11/2014 | Kashiwabara et al. |
| 2015/0118774 A1 | 4/2015 | Sato et al. |
| 2015/0295017 A1 | 10/2015 | Kashiwabara et al. |
| 2016/0041430 A1* | 2/2016 | Lee ................... G02F 1/133514 |
| | | 349/96 |
| 2016/0293673 A1 | 10/2016 | Kashiwabara et al. |
| 2017/0154932 A1 | 6/2017 | Kashiwabara et al. |
| 2018/0197923 A1 | 7/2018 | Kashiwabara et al. |
| 2019/0189701 A1* | 6/2019 | Bang ................. G02F 1/133526 |

\* cited by examiner

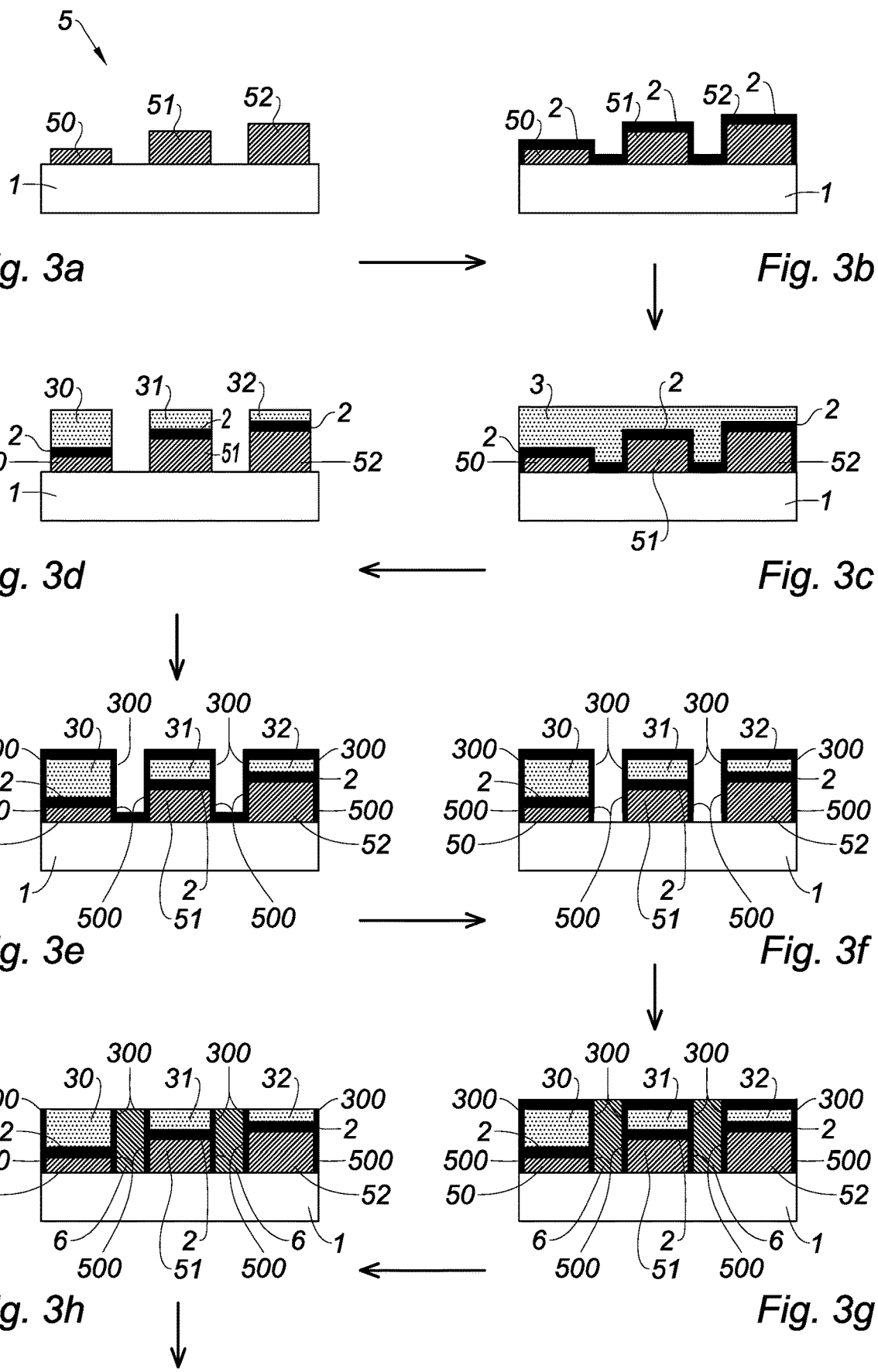

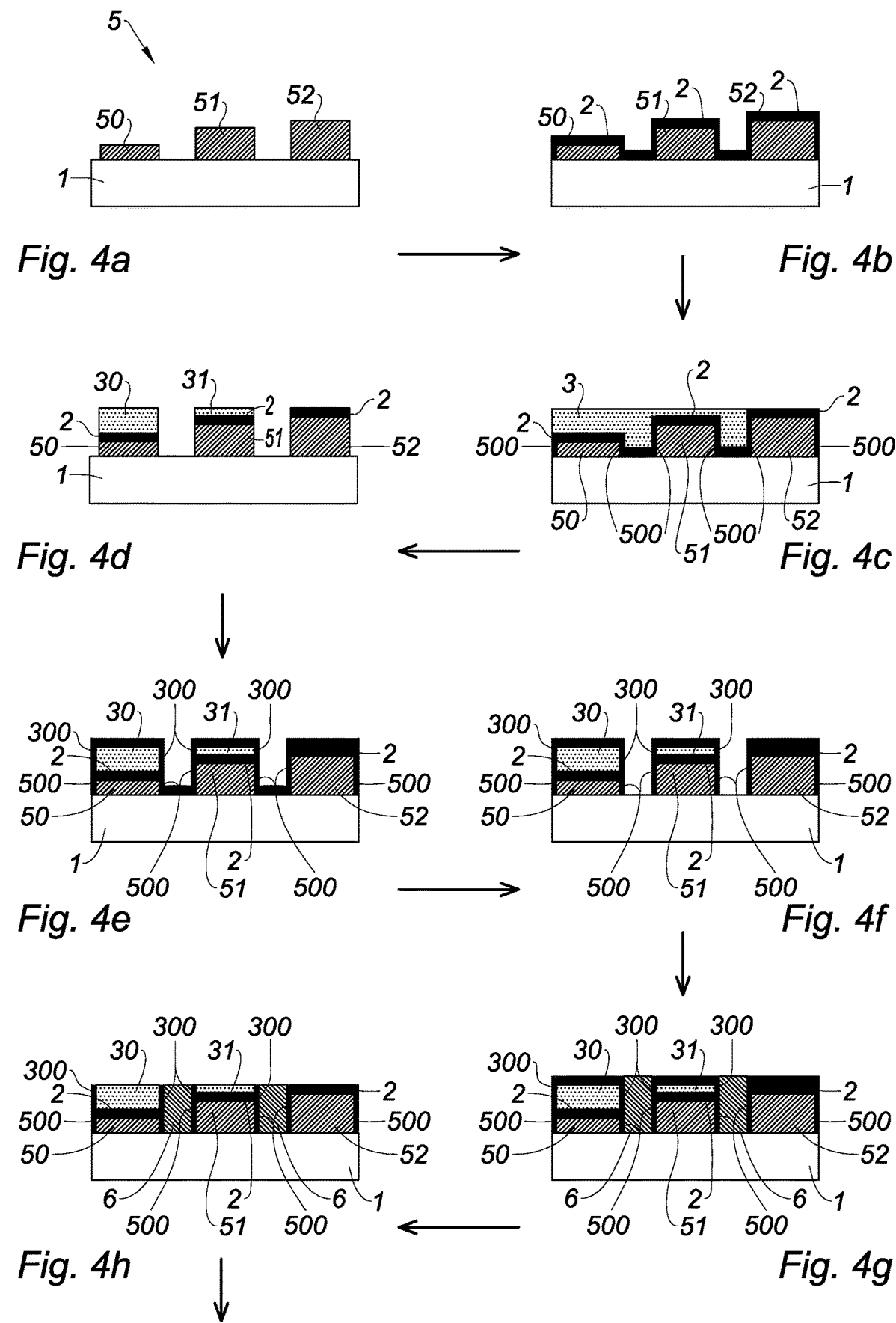

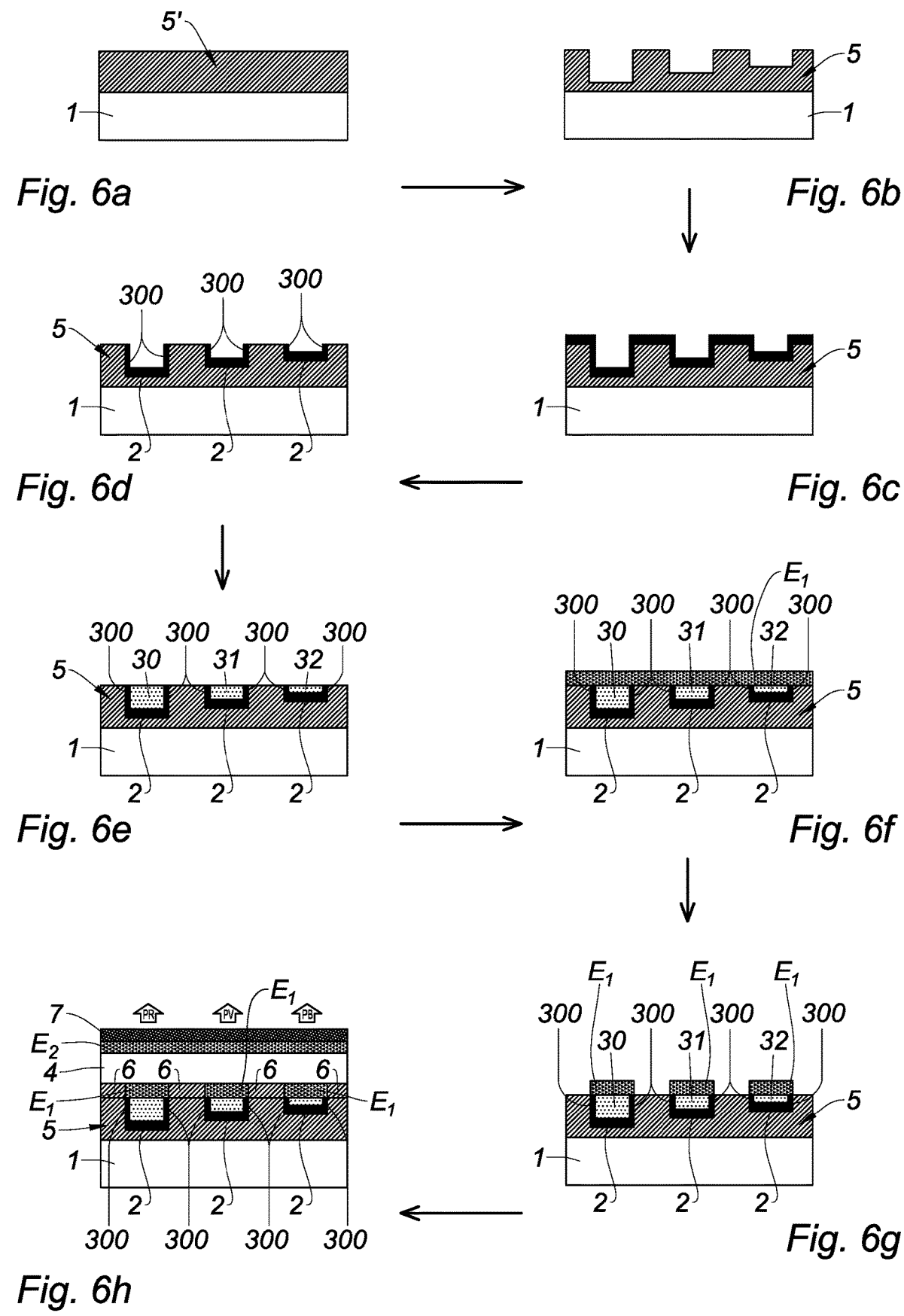

PIXEL FOR AN ORGANIC LIGHT-EMITTING DIODE MICROSCREEN

TECHNICAL FIELD

The invention relates to the technical field of organic light-emitting diode microscreens.

In particular, the invention is applicable to the manufacture of virtual- or augmented-reality headsets and glasses, camera viewfinders, head-up displays, pico-projectors, etc.

PRIOR ART

A pixel for an organic light-emitting diode microscreen known from the prior art, in particular from document U.S. Pat. No. 8,956,898 B2, includes, successively:
- a substrate;
- a reflector that is reflective in the visible spectrum and is formed on the substrate;
- a spacing layer that is formed on the reflector;
- a first electrode that is transparent in the visible spectrum and is formed on the spacing layer;
- a stack of organic light-emitting layers that is configured to emit a white light and is formed on the first electrode;
- a second electrode that is semitransparent in the visible spectrum and is formed on the stack, the second electrode and the reflector forming an optical resonator;

the spacing layer having first, second and third portions, the thicknesses of which are adjusted such that the optical resonator allows, respectively, the transmission of red, green and blue light from the white light emitted by the stack so as to define, respectively, red, green and blue sub-pixels;

By virtue of the reflector and the spacing layer that are arranged below the first, transparent electrode, such a pixel of the prior art allows the stack of organic light-emitting layers to be deposited easily on top of the first electrode, which forms a planar surface, something that is not possible for other architectures such as that described in document EP 1 672 962 A1, in which the stack is formed on the spacing layer, which is non-planar (three portions of different thicknesses).

Furthermore, such a pixel of the prior arts makes it possible to omit colour filters by virtue of the Fabry-Perot optical resonator forming an interference filter. The range of filtered wavelengths is determined by the thicknesses of the first, second and third portions of the spacing layer, allowing the thickness of the optical cavity (delimited by the reflector and the second electrode) to be adjusted such that the optical resonator allows, respectively, the transmission of red, green and blue light from the white light emitted by the stack of organic light-emitting layers. However, such a pixel of the prior art is not entirely satisfactory because the electronic control of the red, green and blue sub-pixels may lead to crosstalk between adjacent sub-pixels.

SUMMARY OF THE INVENTION

The invention aims to completely or partly overcome the aforementioned drawbacks. To this end, one subject of the invention is a pixel for an organic light-emitting diode microscreen, including, successively:
- a substrate;
- a reflector that is reflective in the visible spectrum and is formed on the substrate;
- a spacing layer that is formed on the reflector;
- a first electrode that is transparent in the visible spectrum and is formed on the spacing layer;
- a stack of organic light-emitting layers that is configured to emit a white light and is formed on the first electrode;
- a second electrode that is semitransparent in the visible spectrum and is formed on the stack, the second electrode and the reflector forming an optical resonator;

the spacing layer having first, second and third portions, the thicknesses of which are adjusted such that the optical resonator allows, respectively, the transmission of red, green and blue light from the white light emitted by the stack so as to define, respectively, red, green and blue sub-pixels;

noteworthy in that the first and second portions of the spacing layer each include lateral edges that are covered with a material that is reflective in the visible spectrum.

Thus, such a pixel according to the invention allows crosstalk between the red and green sub-pixels to be significantly decreased by virtue of the reflective lateral edges of the first and second portions of the spacing layer, which improve the confinement of the reflected light rays within the optical cavity.

Definitions

The term "microscreen" is understood to mean a screen in which the area of each pixel is smaller than or equal to 30 µm by 30 µm.

The term "substrate" is understood to mean a self-supporting physical carrier, produced in a base material allowing the incorporation of an electronic device or an electronic component. A substrate is conventionally a wafer cut from a monocrystalline ingot of semiconductor material.

The term "visible spectrum" is understood to mean an electromagnetic spectrum between 380 nm and 780 nm.

The term "reflective" is understood to mean that the intensity reflection coefficient of the corresponding element (i.e. the reflector or the material covering the lateral edges) is higher than or equal to 70%, preferably higher than or equal to 80%, more preferably higher than or equal to 85% and even more preferably higher than or equal to 90% averaged across the visible spectrum.

The term "semitransparent" is understood to mean that the intensity transmission coefficient of the second electrode is strictly lower than 80%, preferably strictly lower than 70% and more preferably strictly lower than 60% averaged over the visible spectrum.

The term "transparent" is understood to mean that the intensity transmission coefficient of the first electrode is higher than or equal to 70%, preferably higher than or equal to 80%, more preferably higher than or equal to 85% and even more preferably higher than or equal to 90% averaged across the visible spectrum.

The term "thickness" is understood to mean the dimension along the normal to the surface of the pixel or of the sub-pixel.

The term "lateral edges" is understood to mean the longitudinal edges extending in a direction that is perpendicular to the normal to the substrate (i.e. the normal to the surface of the pixel or of the sub-pixel).

The pixel according to the invention may include one or more of the following features.

According to one feature of the invention, the third portion of the spacing layer includes lateral edges that are covered with a material that is reflective in the visible spectrum.

Thus, one afforded advantage is that crosstalk between the red, green and blue sub-pixels is significantly decreased by virtue of the reflective lateral edges of the first, second and third portions of the spacing layer, which improve the confinement of the reflected light rays within the optical cavity.

According to one feature of the invention, the thickness of the third portion of the spacing layer is zero, and the thickness of the optical resonator is adjusted so as to allow the transmission of a blue light from the white light emitted by the stack.

Thus, one afforded advantage is that the fabrication of the blue sub-pixel is simplified through not having to control the thickness of the third portion of the spacing layer.

According to one feature of the invention, the substrate includes a structured dielectric layer, preferably made of $SiO_2$ or of SiN, on which the reflector is formed, the structured dielectric layer comprising first, second and third patterns that are associated, respectively, with the red, green and blue sub-pixels;

and the first, second and third patterns each include lateral edges covered with an electrically conductive material, preferably selected from Al, Ag, Pt, Cr, Ni and W, the lateral edges of the first, second and third patterns being electrically insulated from one another.

The term "dielectric" is understood to mean that the electrical conductivity of the layer at 300 K is lower than or equal to $10^{-6}$ S/cm.

The term "electrically conductive" is understood to mean that the electrical conductivity of the material at 300 K is higher than or equal to $10^2$ S/cm.

Thus, one afforded advantage is that interconnect vias, the walls of which are defined by two lateral edges belonging to two adjacent patterns, are formed facing one another. The walls of the interconnect vias are therefore electrically conductive and the walls may be filled with a dielectric material on the inside. Such interconnect vias differ from the prior art in which the walls are dielectric and inside the walls is electrically conductive.

According to one feature of the invention, the reflective material covering the lateral edges of the first and second portions of the spacing layer is electrically conductive; and the lateral edges of the first and second patterns of the structured dielectric layer extend, respectively, in line with the lateral edges of the first and second portions of the spacing layer.

Thus, one afforded advantage is that the interconnect vias (formed by two lateral edges of two adjacent patterns) are electrically connected to the first electrode via the lateral edges of the first and second portions of the spacing layer. Such an architecture allows easy access, with decreased bulk, to a control circuit for the red and green sub-pixels that is incorporated within the substrate.

According to one feature of the invention, the reflective material covering the lateral edges of the first, second and third portions of the spacing layer is electrically conductive;

and the lateral edges of the first, second and third patterns of the structured dielectric layer extend, respectively, in line with the lateral edges of the first, second and third portions of the spacing layer.

Thus, one afforded advantage is that the interconnect vias (formed by two lateral edges of two adjacent patterns) are electrically connected to the first electrode via the lateral edges of the first, second and third portions of the spacing layer. Such an architecture allows easy access, in a compact manner, to a control circuit for the red, green and blue sub-pixels that is incorporated within the substrate.

According to one feature of the invention, the substrate includes a CMOS circuit;

and the lateral edges of the first, second and third patterns of the structured dielectric layer are electrically connected to the CMOS circuit.

Thus, one afforded advantage is easy access, with decreased bulk, to the CMOS control circuit for the red, green and blue sub-pixels that is incorporated within the substrate.

According to one feature of the invention, the reflector is made of a material selected from Al, Ag, Pt, Cr, Ni and W.

Thus, such metallic materials exhibit both a high intensity reflection coefficient in the visible spectrum and high electrical conductivity.

According to one feature of the invention, the reflective material covering the lateral edges of the first, second and third portions of the spacing layer is selected from Al, Ag, Pt, Cr, Ni and W.

Thus, such metallic materials exhibit both a high intensity reflection coefficient in the visible spectrum and high electrical conductivity.

According to one feature of the invention, the spacing layer is made of a material that is electrically conductive and transparent in the visible spectrum, preferably an oxide, more preferably selected from indium tin oxide, tin oxide $SnO_2$ and zinc oxide ZnO.

According to one feature of the invention, the first, second and third portions of the spacing layer include lateral edges that are electrically insulated from one another.

According to one feature of the invention, the first electrode is made of indium tin oxide.

According to one feature of the invention, the second electrode is made of a material selected from Al, Ag, Pt, Cr, Ni and W.

According to one feature of the invention, the substrate is made of a semiconductor material, preferably silicon.

Another subject of the invention is an organic light-emitting diode microscreen including a matrix-array of pixels according to the invention.

Another subject of the invention is a process for fabricating a pixel for an organic light-emitting diode microscreen, including the steps of:

a) providing a substrate;

b) forming a reflector that is reflective in the visible spectrum on the substrate;

c) forming a spacing layer on the reflector;

d) forming a first electrode that is transparent in the visible spectrum on the spacing layer;

e) forming a stack of organic light-emitting layers on the first electrode, the stack being configured to emit a white light;

f) forming a second electrode that is semitransparent in the visible spectrum on the stack, the second electrode and the reflector forming an optical resonator;

step c) being carried out such that the spacing layer has first, second and third portions, the thicknesses of which are adjusted such that the optical resonator allows, respectively, the transmission of red, green and blue light from the white light emitted by the stack so as to define, respectively, red, green and blue sub-pixels, the first and second portions of the spacing layer having lateral edges;

noteworthy in that step c) includes a step of covering the lateral edges of the first and second portions of the spacing layer with a material that is reflective in the visible spectrum.

BRIEF DESCRIPTION OF THE DRAWINGS

Other features and advantages will become apparent in the detailed description of various embodiments of the invention, the description being accompanied by examples and references to the appended drawings.

FIGS. 3a to 3k are schematic cross-sectional views along the normal to the substrate, illustrating steps of a first fabrication process according to the invention.

FIGS. 4a to 4k are schematic cross-sectional views along the normal to the substrate, illustrating steps of a second fabrication process according to the invention.

FIGS. 6a to 6h are schematic cross-sectional views along the normal to the substrate, illustrating steps of a fourth fabrication process according to the invention.

Figure 1:
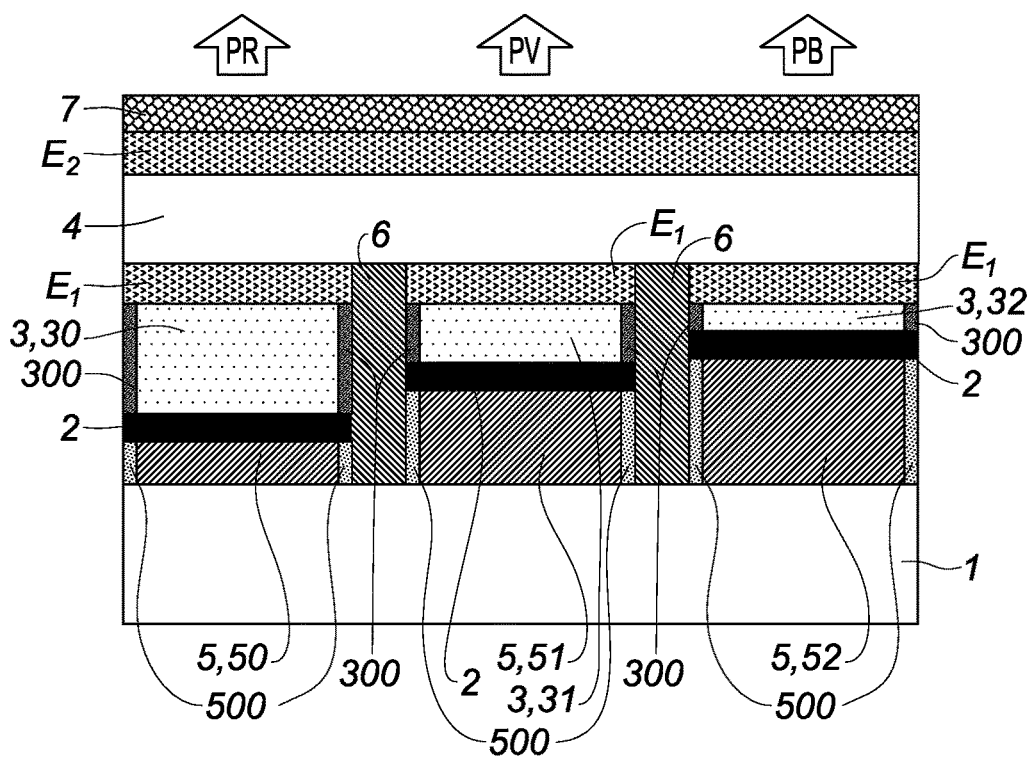
FIG. 1 is a schematic cross-sectional view of a pixel according to the invention, illustrating a first embodiment of the spacing layer, the section being along the normal to the surface of the pixel.

It should be noted that, for the sake of readability and ease of understanding, the drawings described above are schematic and are not to scale.

DETAILED ACCOUNT OF THE EMBODIMENTS

The elements which are identical or provide the same function will carry the same references for the different embodiments, for the sake of simplicity.

One subject of the invention is a pixel for an organic light-emitting diode microscreen, including, successively:
- a substrate 1;
- a reflector 2 that is reflective in the visible spectrum and is formed on the substrate 1;
- a spacing layer 3 that is formed on the reflector 2;
- a first electrode $E_1$ that is transparent in the visible spectrum and is formed on the spacing layer 3;
- a stack 4 of organic light-emitting layers that is configured to emit a white light and is formed on the first electrode $E_1$;
- a second electrode $E_2$ that is semitransparent in the visible spectrum and is formed on the stack 4, the second electrode $E_2$ and the reflector 2 forming an optical resonator;
- the spacing layer 3 having first, second and third portions 30, 31, 32, the thicknesses of which are adjusted such that the optical resonator allows, respectively, the transmission of red, green and blue light from the white light emitted by the stack 4 so as to define, respectively, red, green and blue sub-pixels PR, PV, PB.

The first and second portions 30, 31 of the spacing layer 3 each include lateral edges 300 that are covered with a material that is reflective in the visible spectrum.

Spacing Layer

As illustrated in FIG. 1, the third portion 32 of the spacing layer 3 may include lateral edges 300 that are covered with a material that is reflective in the visible spectrum. The reflective material covering the lateral edges 300 of the first, second and third portions 30, 31, 32 of the spacing layer 3 is advantageously electrically conductive. The reflective material covering the lateral edges 300 of the first, second and third portions 30, 31, 32 of the spacing layer 3 is advantageously selected from Al, Ag, Pt, Cr, Ni and W. The intensity reflection coefficient of the reflective material covering the lateral edges 300 of the first, second and third portions 30, 31, 32 of the spacing layer 3 is higher than or equal to 70%, preferably higher than or equal to 80%, more preferably higher than or equal to 85% and even more preferably higher than or equal to 90% averaged across the visible spectrum.

Figure 2:
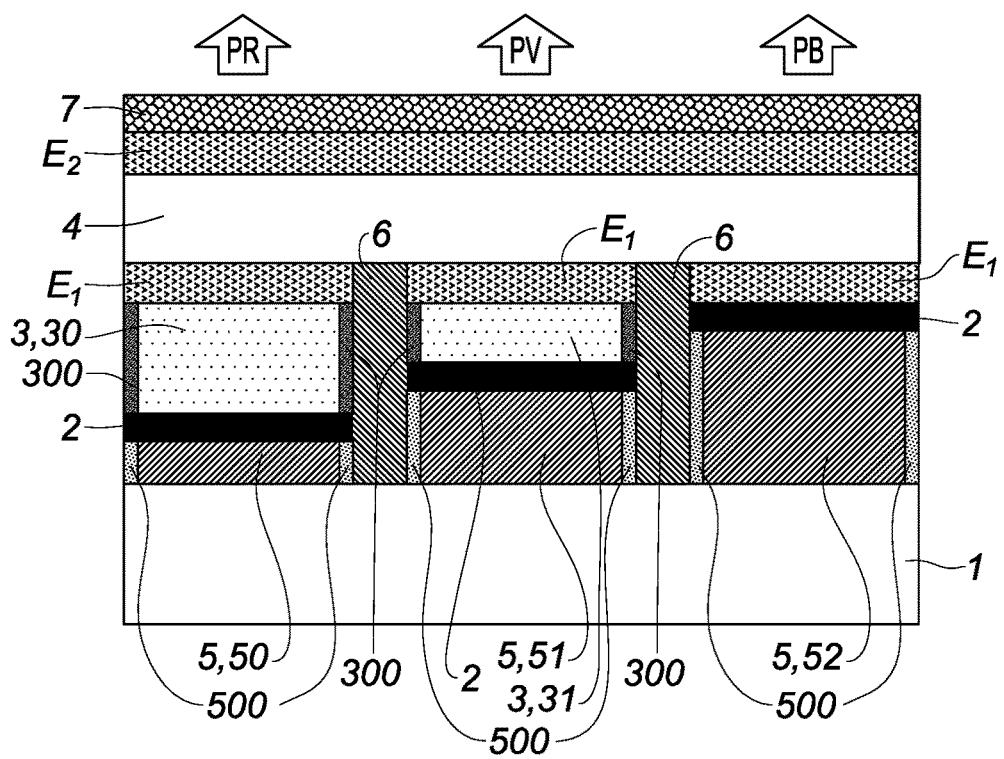
FIG. 2 is a schematic cross-sectional view of a pixel according to the invention, illustrating a second embodiment of the spacing layer, the section being along the normal to the surface of the pixel.

According to one alternative illustrated in FIG. 2, the thickness of the third portion 32 of the spacing layer 3 is zero, and the thickness of the optical resonator is adjusted so as to allow the transmission of a blue light from the white light emitted by the stack 4.

The spacing layer 3 is advantageously made of a material that is electrically conductive and transparent in the visible spectrum, preferably an oxide, more preferably selected from indium tin oxide, tin oxide $SnO_2$ and zinc oxide ZnO.

Substrate

The substrate 1 is advantageously made of a semiconductor material, preferably silicon.

The substrate 1 advantageously includes a structured dielectric layer 5, preferably made of $SiO_2$ or of SiN, on which the reflector 2 is formed. The structured dielectric layer 5 comprises first, second and third patterns 50, 51, 52 that are associated, respectively, with the red, green and blue sub-pixels PR, PV, PB. The first, second and third patterns 50, 51, 52 are separated from one another by a distance corresponding to the desired distance between sub-pixels, for example around 600 nm. The thicknesses of the first, second and third patterns 50, 51, 52 of the structured dielectric layer 5 are advantageously matched to the thicknesses of the first, second and third portions 30, 31, 32 of the spacing layer 3 so as to obtain a planar first electrode $E_1$.

The first, second and third patterns 50, 51, 52 advantageously each include lateral edges 500 that are covered with an electrically conductive material, preferably selected from Al, Ag, Pt, Cr, Ni and W. The lateral edges 500 of the first, second and third patterns 50, 51, 52 are electrically insulated from one another as necessary, preferably via a dielectric interlayer 6, for example made of $SiO_2$ or of SiN. The dielectric interlayer 6 advantageously extends up until it is flush with the surface of the first electrode $E_1$. Thus, the lateral edges 300 of the first, second and third portions 30, 31, 32 of the spacing layer 3 are electrically insulated from one another by the dielectric interlayer 6.

The lateral edges 500 of the first and second patterns 50, 51 of the structured dielectric layer 5 advantageously extend, respectively, in line with the lateral edges 300 of the first and second portions 30, 31 of the spacing layer 3. When the third portion 32 of the spacing layer 3 includes lateral edges 300 that are covered with a material that is reflective in the visible spectrum, the lateral edges 500 of the third pattern 52 of the structured dielectric layer 5 advantageously extend in line with the lateral edges 300 of the third portion 32 of the spacing layer 3.

The substrate 1 may include a CMOS circuit forming a control circuit for the red, green and blue sub-pixels PR, PV, PB. The lateral edges 500 of the first, second and third patterns 50, 51, 52 of the structured dielectric layer 5 are advantageously electrically connected to the CMOS circuit.

Reflector

The reflector 2 is made of a preferably metallic material, more preferably one selected from Al, Ag, Pt, Cr, Ni and W. The material of which the reflector 2 is made is advantageously identical to the reflective material covering the lateral edges 300 of the first, second and third portions 30, 31, 32 of the spacing layer 3 so as to simplify the fabrication process. Likewise, the material of which the reflector 2 is made is advantageously identical to the electrically conductive material covering the lateral edges 500 of the first, second and third patterns 50, 51, 52 of the structured dielectric layer 5 so as to simplify the fabrication process.

The thickness of the reflector 2 is preferably between 0.1 µm and 2 µm.

The reflection coefficient of the reflector 2 is higher than or equal to 70%, preferably higher than or equal to 80%, more preferably higher than or equal to 85% and even more preferably higher than or equal to 90% averaged across the visible spectrum.

First and Second Electrodes

The thicknesses of the first and second electrodes $E_1$, $E_2$ of each red, green and blue sub-pixel PR, PV, PB are constant.

The first electrode $E_1$ of each red, green and blue sub-pixel PR, PV, PB is advantageously made of indium tin oxide. The intensity transmission coefficient of the first electrode $E_1$ of each red, green and blue sub-pixel PR, PV, PB is higher than or equal to 70%, preferably higher than or equal to 80%, more preferably higher than or equal to 85% and even more preferably higher than or equal to 90% averaged across the visible spectrum.

The second electrode $E_2$ of each red, green and blue sub-pixel PR, PV, PB is advantageously made of a metallic material, preferably selected from Al, Ag, Pt, Cr, Ni and W. The intensity transmission coefficient of the second electrode $E_2$ of each red, green and blue sub-pixel PR, PV, PB is strictly lower than 80%, preferably strictly lower than 70% and more preferably strictly lower than 60% averaged over the visible spectrum. By way of nonlimiting example, the second electrode $E_2$ of each red, green and blue sub-pixel PR, PV, PB may be made of Al and be between 10 nm and 20 nm in thickness.

The first electrode $E_1$ is preferably an anode and the second electrode $E_2$ is preferably a cathode.

The second electrode $E_2$ is advantageously coated with an encapsulation layer 7 that is suitable for protecting the second electrode $E_2$ and the stack 4 of each red, green and blue sub-pixel PR, PV, PB from air and moisture.

Stack of Organic Light-Emitting Layers

The thickness of the stack 4 of organic light-emitting layers is constant for each red, green and blue sub-pixel PR, PV, PB.

By way of nonlimiting example, the stack 4 may include three emissive layers in tandem. More specifically, when the first electrode $E_1$ is an anode and the second electrode $E_2$ is a cathode, the stack 4 may include:
  a first hole transport layer that is formed on the first electrode $E_1$;
  a first emissive layer, emitting a blue light, that is formed on the first hole transport layer;
  a first electron transport layer that is formed on the first emissive layer;
  a charge generation layer (also known as an interconnect layer) that is formed on the first electron transport layer;
  a second hole transport layer that is formed on the charge generation layer;
  a second emissive layer, emitting a green light, that is formed on the second hole transport layer;
  a third emissive layer, emitting a red light, that is formed on the second emissive layer;
  a second electron transport layer that is formed on the third emissive layer and is intended to be coated with the second electrode $E_2$.

As variants, the stack 4 may include:
  three emissive layers emitting, respectively, blue, green and red light without being arranged in tandem (conventional structure);
  two emissive layers emitting, respectively, yellow and blue light that are arranged in a conventional structure;
  two emissive layers emitting, respectively, yellow and blue light that are arranged in tandem.

Microscreen

One subject of the invention is an organic light-emitting diode microscreen including a matrix-array of pixels according to the invention. The pitch of the pixels in the matrix-array is preferably between 4 µm and 5 µm.

Process for Fabricating the Pixel

One subject of the invention is a process for fabricating a pixel for an organic light-emitting diode microscreen, including the steps of:
  a) providing a substrate 1;
  b) forming a reflector 2 that is reflective in the visible spectrum on the substrate 1;
  c) forming a spacing layer 3 on the reflector 2;
  d) forming a first electrode $E_1$ that is transparent in the visible spectrum on the spacing layer 3;
  e) forming a stack 4 of organic light-emitting layers on the first electrode $E_1$, the stack 4 being configured to emit a white light;
  f) forming a second electrode $E_2$ that is semitransparent in the visible spectrum on the stack 4, the second electrode $E_2$ and the reflector 2 forming an optical resonator.

Step c) is carried out such that the spacing layer 3 has first, second and third portions 30, 31, 32, the thicknesses of which are adjusted such that the optical resonator allows, respectively, the transmission of red, green and blue light from the white light emitted by the stack 4 so as to define, respectively, red, green and blue sub-pixels PR, PV, PB, the first and second portions 30, 31 of the spacing layer 3 having lateral edges 300.

Step c) includes a step of covering the lateral edges 300 of the first and second portions 30, 31 of the spacing layer 3 with a material that is reflective in the visible spectrum.

First Implementation (FIGS. 3a to 3k)

As illustrated in FIG. 3a, step a) may be carried out by means of three successive depositions of $SiO_2$ on the substrate 1, forming the first, second and third patterns 50, 51, 52 of the structured dielectric layer 5.

As illustrated in FIG. 3b, step b) includes an operation of depositing the material of the reflector 2, for example Al to a thickness of 100 nm. It may be deposited by physical vapour deposition.

As illustrated in FIG. 3c, step c) includes a wafer-scale deposition of the material of the spacing layer 3 and a planning step, preferably carried out by means of chemical-mechanical polishing.

As illustrated in FIG. 3d, steps b) and c) are finished using lithography so as to etch the materials of the reflector 2 and of the spacing layer 3 and to delimit the red, green and blue sub-pixels PR, PV, PB.

As illustrated in FIG. 3e, step c) includes a step $c_1$) of covering the lateral edges 300 of the first, second and third portions 30, 31, 32 of the spacing layer 3 with a material that is reflective in the visible spectrum. Step $c_1$) may be carried out by depositing the reflective material, for example Al to a thickness of 100 nm. Step $c_1$) also leads to the lateral edges 500 of the first, second and third patterns 50, 51, 52 of the structured dielectric layer 5 being covered with the reflective material, the reflective material being chosen so as to be electrically conductive in addition.

As illustrated in FIGS. 3f and 3g, step c₁) is followed by an operation of etching the bottom of the trenches then of filling the trenches with a dielectric interlayer 6, for example made of SiO₂ or of SiN.

As illustrated in FIG. 3h, the process includes a planning step, preferably carried out by means of chemical-mechanical polishing, so as to free the surface of the spacing layer 3.

Figure 3I:
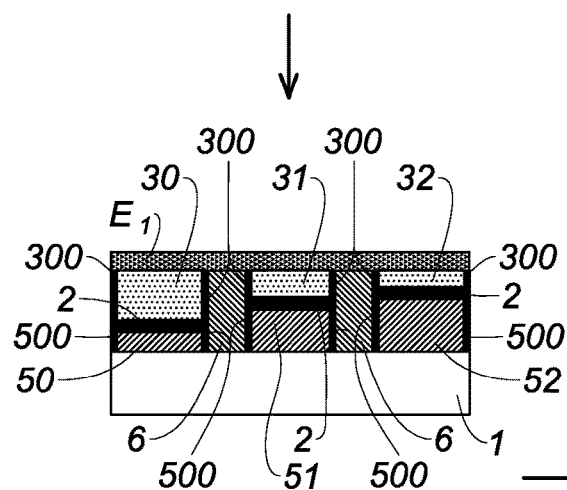
Figure 3J:
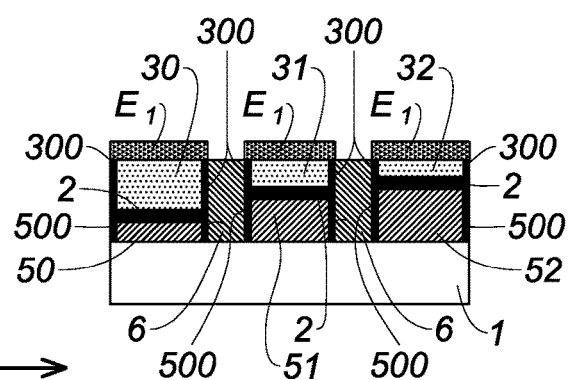

As illustrated in FIGS. 3i and 3j, step d) includes a wafer-scale deposition of the first electrode $E_1$ followed by a lithography operation suitable for delimiting the red, green and blue sub-pixels PR, PV, PB.

Figure 3K:
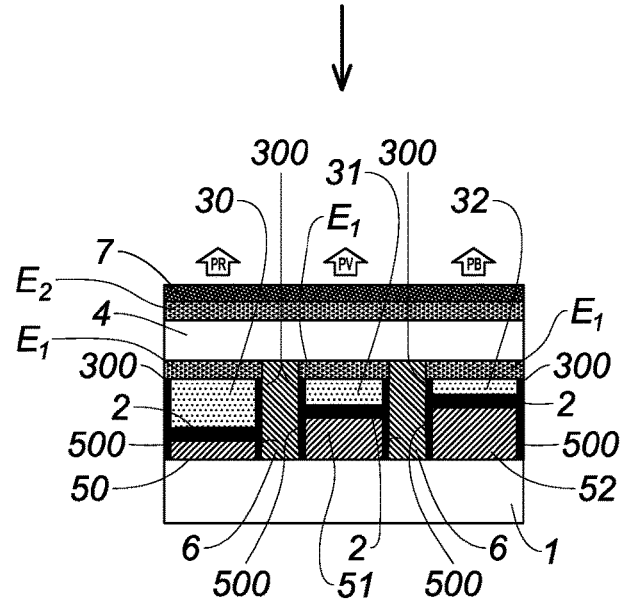
Figures 4I, 4J, 4K:
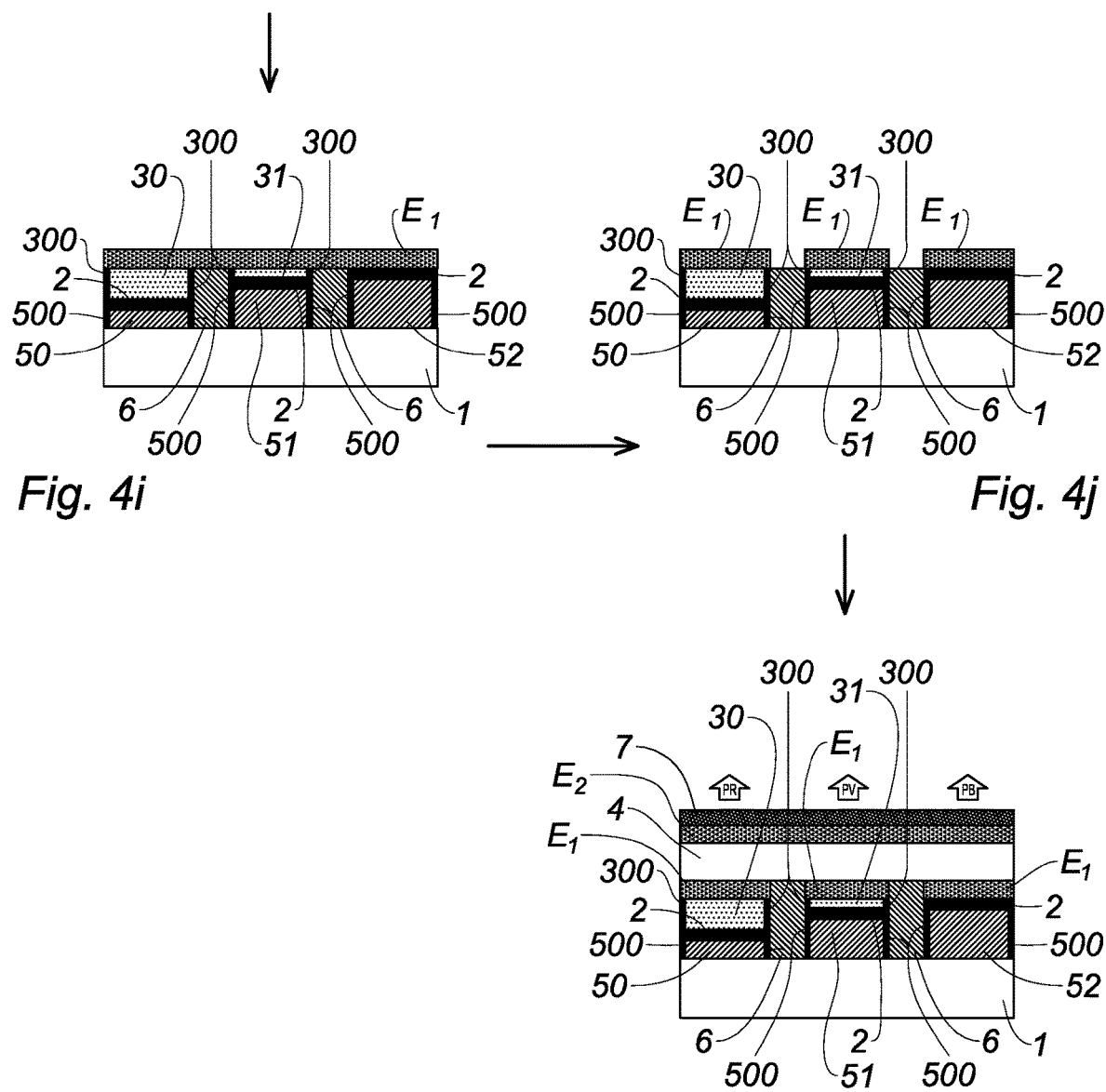

As illustrated in FIG. 3k, steps e) and f) are carried out by means of deposition techniques known to those skilled in the art. The process may also include a step of forming an encapsulation layer 7 over the second electrode $E_2$. The process may also include a step of extending the dielectric interlayer 6 until it is flush with the surface of the first electrode $E_1$.

Second Implementation (FIGS. 4a to 4k)

As illustrated in FIG. 4c, the second implementation differs from the first implementation in that the planning step, preferably a chemical-mechanical polishing operation, of step c) stops at the material of the reflector 2 extending over the third pattern 52 of the structured dielectric layer 5. Thus, the thickness of the third portion 32 of the spacing layer 3 is zero, and the thicknesses of the first and second portions 30, 31 of the spacing layer 3 are perfectly controlled.

Third Implementation (FIGS. 5a to 5k)

Figure 5A:
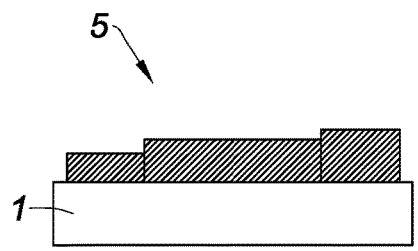
FIGS. 5a to 5k are schematic cross-sectional views along the normal to the substrate, illustrating steps of a third fabrication process according to the invention.
Figure 5B:
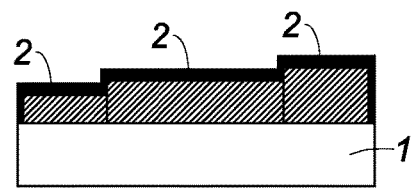
Figure 5D:
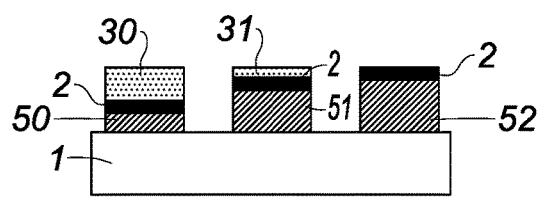
Figure 5C:
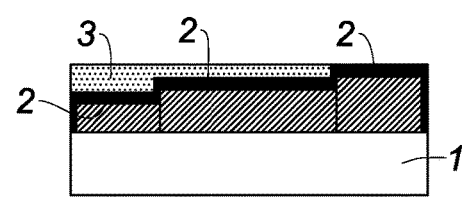
Figure 5E:
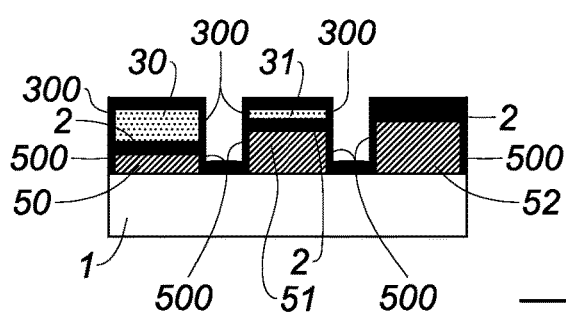
Figure 5F:
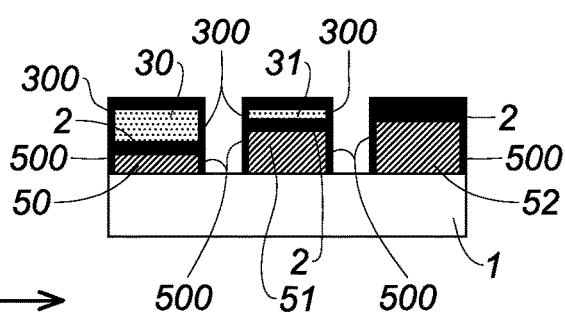
Figure 5H:
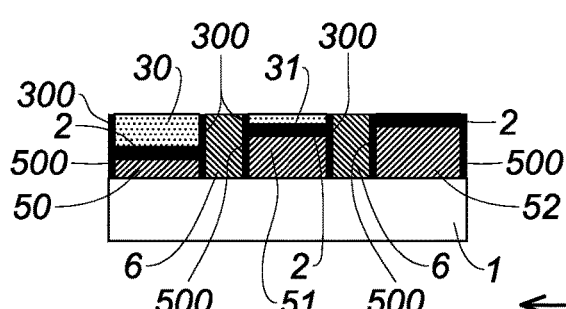
Figure 5G:
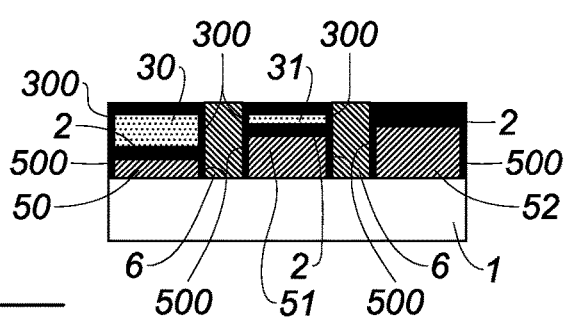
Figure 5I:
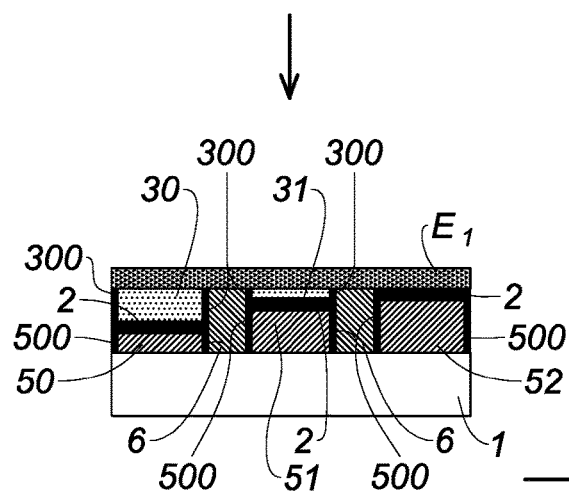
Figure 5J:
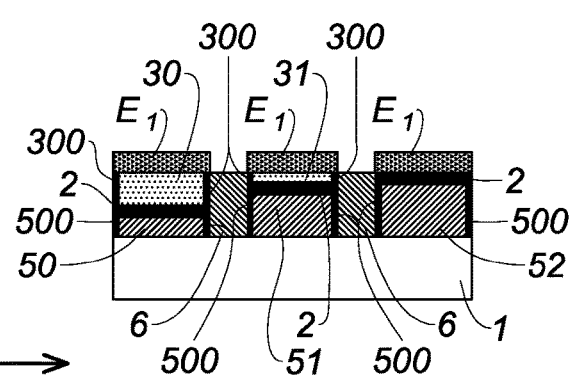
Figure 5K:
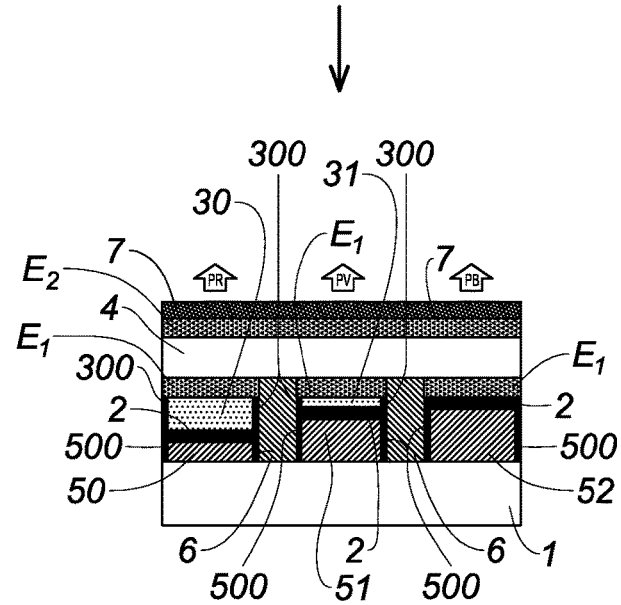

As illustrated in FIG. 5a, the third implementation differs from the second implementation in that the structured dielectric layer 5 is deposited in the form of continuous steps.

Fourth Implementation (FIGS. 6a to 6h)

As illustrated in FIGS. 6a and 6b, step a) may be carried out by means of a wafer-scale deposition of a dielectric layer 5' (for example made of SiO₂ to a thickness of 150 nm) on the substrate 1, followed by an operation of structuring the dielectric layer 5' (by means of lithography) so as to obtain a structured dielectric layer 5 and to delimit the red, green and blue sub-pixels PR, PV, PB.

As illustrated in FIG. 6c, step b) includes an operation of depositing the material of the reflector 2, for example Al to a thickness of 100 nm, on the structured dielectric layer 5. It may be deposited by physical vapour deposition.

As illustrated in FIG. 6d, the material of the reflector 2 on the surface is removed, for example by means of chemical-mechanical polishing.

As illustrated in FIG. 6e, step c) includes:
an operation of depositing the material of the spacing layer 3 on the material of the reflector 2 such that the lateral edges 300 of the first, second and third portions 30, 31, 32 of the spacing layer 3 are covered with the material of the reflector 2.
an operation of planing the spacing layer 3, preferably by means of chemical-mechanical polishing.

As illustrated in FIGS. 6f and 6g, step d) includes a wafer-scale deposition of the first electrode $E_1$ followed by a lithography operation suitable for delimiting the red, green and blue sub-pixels PR, PV, PB.

As illustrated in FIG. 6h, steps e) and f) are carried out by means of deposition techniques known to those skilled in the art. The process may also include a step of forming an encapsulation layer 7 over the second electrode $E_2$. The process may also include a step of forming a dielectric interlayer 6 on the structured dielectric layer 5 until it is flush with the surface of the first electrode $E_1$.

The invention is not limited to the described embodiments. A person skilled in the art is capable of considering technically feasible combinations thereof and of substituting them with equivalents.

The invention claimed is:

1. A pixel for an organic light-emitting diode microscreen, comprising, successively:
   a substrate;
   a reflector that is reflective in the visible spectrum and is formed on the substrate;
   a spacing layer that is formed on the reflector;
   a first electrode that is transparent in the visible spectrum and is formed on the spacing layer;
   a stack of organic light-emitting layers that is configured to emit a white light and is formed on the first electrode;
   a second electrode that is semitransparent in the visible spectrum and is formed on the stack, the second electrode and the reflector forming an optical resonator;
   wherein
   the spacing layer has first, second and third portions, the thicknesses of which are adjusted such that the optical resonator allows, respectively, the transmission of red, green and blue light from the white light emitted by the stack so as to define, respectively, red, green and blue sub-pixels;
   the first, second and third portions of the spacing layer each includes lateral edges extending from the first electrode toward the reflector that are covered with a material that is reflective in the visible spectrum; and
   the material covering the lateral edges has an uppermost surface located beneath and not in contact with the stack.

2. The pixel according to claim 1, wherein the substrate comprises a structured dielectric layer, made of SiO2 or of SiN, on which the reflector is formed, the structured dielectric layer comprising first, second and third patterns that are associated, respectively, with the red, green and blue sub-pixels;
   and wherein the first, second and third patterns each include lateral edges covered with an electrically conductive material, selected from Al, Ag, Pt, Cr, Ni and W, the lateral edges of the first, second and third patterns being electrically insulated from one another.

3. The pixel according to claim 2, wherein the reflective material covering the lateral edges of the first, second and third portions of the spacing layer is electrically conductive;
   and wherein the lateral edges of the first, second and third patterns of the structured dielectric layer extend, respectively, in line with the lateral edges of the first, second and third portions of the spacing layer.

4. The pixel according to claim 2, wherein the substrate comprises a CMOS circuit; and
   wherein the lateral edges of the first, second and third patterns of the structured dielectric layer are electrically connected to the CMOS circuit.

5. The pixel according to claim 1, wherein the reflector is made of a material selected from Al, Ag, Pt, Cr, Ni and W.

6. The pixel according to claim 1, wherein the reflective material covering the lateral edges of the first, second and third portions of the spacing layer is selected from Al, Ag, Pt, Cr, Ni and W.

7. The pixel according to claim 1, wherein the spacing layer is made of a material that is electrically conductive and transparent in the visible spectrum, selected from indium tin oxide, tin oxide SnO2 and zinc oxide ZnO.

8. The pixel according to claim 1, wherein the lateral edges of the first, second and third portions of the spacing layer are electrically insulated from one another.

9. An organic light-emitting diode microscreen comprising a matrix-array of pixels according to claim 1.

10. The pixel according to claim 1, wherein:
the material is electrically conductive, and
the lateral edges of the first and second portions are electrically insulated from one another.

11. A process for fabricating a pixel for an organic light-emitting diode microscreen, comprising the steps of:
a) providing a substrate;
b) forming a reflector that is reflective in the visible spectrum on the substrate;
c) forming a spacing layer on the reflector;
d) forming a first electrode that is transparent in the visible spectrum on the spacing layer;
e) forming a stack of organic light-emitting layers on the first electrode, the stack being configured to emit a white light; and
f) forming a second electrode that is semitransparent in the visible spectrum on the stack, the second electrode and the reflector forming an optical resonator; wherein
step c) is carried out such that the spacing layer has first, second and third portions, the thicknesses of which are adjusted such that the optical resonator allows, respectively, the transmission of red, green and blue light from the white light emitted by the stack so as to define, respectively, red, green and blue sub-pixels, the first and second portions of the spacing layer having outermost lateral edges;
step c) comprises a step of covering the lateral edges of the first and second portions of the spacing layer with a material that is reflective in the visible spectrum, the lateral edges extending from the first electrode toward the reflector; and
step c) comprises forming the material on lateral edges to be located beneath and having an uppermost surface not in contact with the stack.

12. The process according to claim 11, wherein the material is electrically conductive, the process further comprising covering the lateral edges with the electrically conductive material such that the lateral edges are electrically insulated from one another.

13. The process according to claim 12, wherein the material is selected from Al, Ag, Pt, Cr, Ni and W.

14. A pixel for an organic light-emitting diode microscreen, comprising:
a substrate;
a reflector that is reflective in the visible spectrum and is formed on the substrate;
a spacing layer that is formed on the reflector;
a first electrode that is transparent in the visible spectrum and is formed on the spacing layer;
a stack of organic light-emitting layers that is configured to emit a white light and is formed on the first electrode; and
a second electrode that is semitransparent in the visible spectrum and is formed on the stack, the second electrode and the reflector forming an optical resonator, wherein
the spacing layer comprises first and second portions, the thicknesses of which are configured such that the optical resonator allows, respectively, the transmission of red and green light from the white light emitted by the stack so as to define, respectively, red and green sub-pixels;
the pixel contains a third portion configured such that the optical resonator allows transmission of a blue light from the white light emitted by the stack so as to define a blue sub-pixel, and
the first and second portions of the spacing layer each include lateral edges extending from the first electrode toward the reflector that are covered with a material that is reflective in the visible spectrum, and
the material covering the lateral edges has an uppermost surface located beneath and not in contact with the stack.

15. The pixel according to claim 14, wherein:
the material is electrically conductive, and
the lateral edges of the first and second portions are electrically insulated from one another.

16. The pixel according to claim 14, wherein the material is selected from Al, Ag, Pt, Cr, Ni and W.

17. The pixel according to claim 14, wherein the substrate comprises a structured dielectric layer, made of SiO2 or of SiN, on which the reflector is formed, the structured dielectric layer comprising first, second and third patterns that are associated, respectively, with the red, green and blue sub-pixels; and
wherein the first, second and third patterns each include lateral edges covered with an electrically conductive material, selected from Al, Ag, Pt, Cr, Ni and W, the lateral edges of the first, second and third patterns being electrically insulated from one another.

18. The pixel according to claim 2, wherein the reflective material covering the lateral edges of the first and second portions of the spacing layer is electrically conductive;
and wherein the lateral edges of the first and second patterns of the structured dielectric layer extend, respectively, in line with the lateral edges of the first and second portions of the spacing layer.

19. The pixel according to claim 17, wherein the substrate comprises a CMOS circuit; and
wherein the lateral edges of the first, second and third patterns of the structured dielectric layer are electrically connected to the CMOS circuit.

20. The pixel according to claim 14, wherein the reflector is made of a material selected from Al, Ag, Pt, Cr, Ni and W.

21. The pixel according to claim 14, wherein the spacing layer is made of a material that is electrically conductive and transparent in the visible spectrum, selected from indium tin oxide, tin oxide SnO2 and zinc oxide ZnO.

* * * * *